United States Patent
Wallgram et al.

(10) Patent No.: US 8,388,709 B2
(45) Date of Patent: Mar. 5, 2013

(54) COATED ARTICLE

(75) Inventors: Wolfgang Wallgram, Breitenwang (AT); Uwe Schleinkofer, Reutte (AT); Karl Gigl, Vils (AT); Josef Thurner, Heiterwang (AT)

(73) Assignee: Ceratizit Austria Gesellschaft GmbH, Reutte (AT)

( * ) Notice: Subject to any disclaimer, the term of this patent is extended or adjusted under 35 U.S.C. 154(b) by 292 days.

(21) Appl. No.: 12/746,638

(22) PCT Filed: Dec. 4, 2008

(86) PCT No.: PCT/AT2008/000430
§ 371 (c)(1),
(2), (4) Date: Jun. 7, 2010

(87) PCT Pub. No.: WO2009/070820
PCT Pub. Date: Jun. 11, 2009

(65) Prior Publication Data
US 2010/0279093 A1   Nov. 4, 2010

(30) Foreign Application Priority Data
Dec. 6, 2007 (AT) ............... GM732/2007

(51) Int. Cl.
*C23C 16/38* (2006.01)

(52) U.S. Cl. ............ 51/307; 51/309; 428/216; 428/336; 428/325; 428/698; 427/255.23; 427/255.26; 427/255.28; 427/255.32; 427/255.39; 427/255.391

(58) Field of Classification Search ............ 51/307, 51/309; 428/216, 336, 325, 698; 427/255.23, 427/255.26, 255.28, 255.32, 255.39, 255.391
See application file for complete search history.

(56) References Cited

U.S. PATENT DOCUMENTS

| | | | | |
|---|---|---|---|---|
| 4,019,873 A | * | 4/1977 | Reiter | 428/217 |
| 4,237,184 A | * | 12/1980 | Gonseth et al. | 428/336 |
| 4,268,582 A | * | 5/1981 | Hale et al. | 428/698 |
| 4,554,201 A | * | 11/1985 | Andreev et al. | 428/215 |
| 4,692,385 A | * | 9/1987 | Johnson | 428/469 |
| 6,770,358 B2 | * | 8/2004 | Berger et al. | 51/307 |
| 7,147,939 B2 | * | 12/2006 | Henderer et al. | 428/698 |
| 7,244,519 B2 | * | 7/2007 | Festeau et al. | 428/698 |
| 2006/0051618 A1 | | 3/2006 | Festeau et al. | |

FOREIGN PATENT DOCUMENTS
AT    8939 U1    2/2007
(Continued)

OTHER PUBLICATIONS

Chinese Office Action dated Jun. 30, 2011. English Translation.
Motojima et al: "Chemical Vapour Deposition of TiB2 Protective Layers on a Brass Plate", Journal of Materials Science, XP000009259, Dec. 1, 1988, pp. 4375-4378, Japan.

(Continued)

*Primary Examiner* — Archene Turner
(74) *Attorney, Agent, or Firm* — Laurence A. Greenberg; Werner H. Stemer; Ralph E. Locher (57) ABSTRACT

A coated article, in particular a tool for cutting machining, has at least one titanium diboride layer which has been deposited by a thermal CVD process and has a thickness of at least 0.1 μm. The titanium diboride layer has an extremely fine-grained microstructure with an average grain size of not more than 50 nm.

16 Claims, 9 Drawing Sheets

FOREIGN PATENT DOCUMENTS

| | | | |
|---|---|---|---|
| DE | 144930 | A1 | 11/1980 |
| DE | 102005036562 | A1 | 2/2007 |
| EP | 0978811 | A2 | 2/2000 |
| EP | 1276086 | A1 | 1/2003 |
| EP | 1744292 | A2 | 1/2007 |
| JP | 58209554 | A | 12/1983 |
| SU | 959345 | * | 5/1983 |
| WO | 0013368 | A1 | 3/2000 |
| WO | 0135372 | A1 | 5/2001 |

OTHER PUBLICATIONS

Caputo et al: "Chemical Vapor Deposition of Erosion-Resistant TiB2 Coatings", Electrochemical Society Extended Abstracts 1984 Electromechanical Socity Inc., XP002521751, Sep. 1985, pp. 2274-2278, Tennessee, USA.

Pierson et al: "The Chemical Vapor Deposition of TiB2 from Diborane", XP024574685, Oct. 15, 1980, pp. 511-516, New Mexico, USA.

* cited by examiner

COATED ARTICLE

BACKGROUND OF THE INVENTION

Field of the Invention

The invention relates to a coated article, consisting of a substrate material and a hard material coating having one or more layers, the hard material coating comprising at least one titanium diboride layer which is deposited by a thermal CVD method and is at least 0.1 μm thick.

It is known to deposit hard material coatings, which have one or more layers and comprise at least one titanium diboride layer, by various coating methods, such as PVD (physical vapor deposition), CVD (chemical vapor deposition) or plasma-enhanced CVD methods (P-CVD, ICP-PVD).

When a CVD method is generally referred to, this usually means the thermal CVD method in which a corresponding hard material coating is deposited on the substrate in a chamber in a temperature range above 700 to 750° C. under normal pressure or negative pressure with the aid of a gas mixture of the reaction components, which decomposes at the coating temperatures.

In the plasma-enhanced CVD method, the reaction components of the gas mixture decompose as a result of a plasma applied in the reaction space and by the effect of temperature. The plasma may, for example, be generated by radiofrequency (P-CVD) or by induction (ICP-CVD=Inductively Coupled Plasma CVD). Much lower temperatures, in the range of about 400 to 600° C., are incurred in this case, compared with the thermal CVD method, so that substrates whose structure might be modified by excessive heating can also be coated. Plasma-enhanced CVD methods entail great outlay on process technology and equipment, and have not yet gained widespread acceptance in practice for the economically viable coating of mass-produced wear-resistant parts, for example disposable cutting inserts for machining.

In the PVD method, the substrates to be coated are coated with the desired hard material coating in a temperature range of between 300 and 500° C. by physical ablation of a suitable coating source and by introducing a reactive gas component.

Wear-resistant articles on which a hard material coating having a titanium diboride layer has been produced by means of a thermal CVD method have a diffusion zone containing boron between the substrate material and the titanium diboride layer, or in many cases between the titanium diboride layer and another hard material layer lying underneath. This diffusion zone leads to embrittlement of this region, possibly associated with a poor adhesion strength of the titanium diboride layer, and therefore to a reduced wear resistance of the coated article. For this reason, wear-resistant parts, in particular cutting inserts having a titanium diboride layer, are in the majority of cases coated by means of PVD methods, even though PVD methods are generally associated with higher production costs than thermal CVD methods.

Titanium diboride layers, which are deposited by a PVD method, have a textured layer structure with a columnar configuration. The hardness of these layers is about 3000 (HV 0.03), which in terms of wear resistance is often only partially sufficient for machining materials which are particularly difficult to machine, such as titanium.

DE 25 25 185 describes wear-resistant shaped parts which consist of a hard metal base body and a hard material coating, the hard material coating being composed of two sub-layers lying above one another, the outer of which consists of aluminum oxide and/or zirconium oxide and the inner sub-layer consists of one or more borides, in particular diborides of the elements titanium, zirconium, hafnium, vanadium, niobium, tantalum, chromium, molybdenum and tungsten.

In one exemplary embodiment, in a first stage a hard metal body is provided with a 3 μm thick titanium diboride layer. This layer is deposited at 1000° C. and with a pressure of 50 Torr, for one hour by using a gas mixture consisting of 1900 I hydrogen, 20 ml $TiCl_4$ and 4 g $BCl_3$.

In a second reaction stage, the $TiB_2$-coated hard metal body is then covered with a 5 μm thick aluminum oxide layer.

A disadvantage with this hard metal body is that the boron diffuses into the hard metal owing to the coating conditions selected for the deposition of the titanium diboride layer. At the same time, a strong eta phase and/or brittle phases containing boron are formed, which significantly reduce the service life of the hard metal body. The titanium diboride layer furthermore has a granular to columnar structural configuration, which has average grain sizes in the μm range.

EP 0 015 451 describes a coated hard metal article having a multi-layer hard material coating with an outer 5 to 20 μm thick layer of a boride, which is selected from titanium boride, hafnium boride, zirconium boride and tantalum boride.

In a production example, the production of an approximately 10 μm thick titanium diboride layer by deposition from a gas mixture having 3.3 vol. % $BCl_3$, 2 vol. % $TiCl_4$, the remainder being hydrogen, at about 800° C. and with a pressure of $10^5$ Pa over a period of 90 minutes is described.

On a coated hard metal article which is coated according to this method, the titanium diboride layer also has a granular to columnar structural configuration, which has average grain sizes in the μm range.

EP 1 245 693 describes a cutting insert consisting of a substrate and a hard material coating, which comprises at least one layer of titanium diboride.

According to the production examples in this document, the titanium diboride layer is produced by a PVD method. The titanium diboride layer has a fibrous microstructure with cylindrical grains having a diameter in the range of from 5 to 50 nm and with a length of more than 260 nm. The cylindrical grains are arranged essentially perpendicularly to the substrate surface.

BRIEF SUMMARY OF THE INVENTION

It is an object of the invention to provide an article coated with a hard material coating, whose hard material coating comprises a titanium diboride layer, which is economical to produce and which has much better wear resistance in comparison with known hard material coatings having a titanium diboride layer.

According to the invention, this is achieved in that the titanium diboride layer has an extremely fine-grained structure with an average grain size of at most 50 nm.

According to the invention, it has surprisingly been discovered that on wear-resistant articles which comprise a hard material coating having a titanium diboride layer, the wear resistance can be increased when the latter has a structural configuration according to the invention.

The titanium diboride layer according to the invention has a hardness of more than 4300 (HV 0.03), which leads to a very significant increase in the wear resistance. Owing to the extremely fine granularity, the surface is furthermore very smooth so that, in particular when machining materials which are difficult to machine, such as titanium alloys, no adhesion takes place with the swarf being removed so that the processing reliability is increased considerably.

What is important in this case is that an average grain size of at most 50 nm is not exceeded for the titanium diboride layer, since then the advantageous effect would be lost again.

It is furthermore advantageous for the titanium diboride layer to exist in essentially one phase. Here, "essentially" is intended to mean that no other phase components can be detected by the conventional phase determination methods.

The hard material coating according to the invention may be configured either as a single titanium diboride layer or as a multi-layer hard material coating having one or more titanium diboride layers in alternation with other conventional hard material layers such as titanium nitride, titanium carbide, titanium carbonitride, titanium carboboronnitride, aluminum oxide, etc.

In particular hard metal and cermet, but also steel and ceramic, are suitable as a substrate material.

It is particularly advantageous for the titanium diboride layer to have a layer thickness in the range of from 0.1 μm to 15 μm, particularly in the range of from 1 μm to 10 μm. A layer thickness of less than 0.1 μm would not lead to any significant increase in the wear resistance of the substrate material, while layer thicknesses of more than 15 μm would be too brittle in relation to their toughness for use above all in metal machining.

In particular, it has been found suitable for a hard metal to be used as the substrate material, and for the coated article to be a tool, in particular a disposable cutting insert.

If the coated article is configured as a cutting tool, it may in particular be advantageous for the hard material coating to be configured in a plurality of layers, and for the titanium diboride layer to be provided in alternation with one or more conventional hard material layers.

A particularly advantageous cutting tool has a layer structure of the hard material coating which, starting from the substrate surface, consists of one or more layers from the group titanium nitride, titanium carbonitride and titanium carboboronnitride with a total layer thickness in the range of from 0.1 μm to 3 μm, followed by a 1 μm to 5 μm thick titanium diboride layer.

Another particularly advantageous cutting tool has a layer structure of the hard material coating as described above, with a cover layer consisting of one or more layers from the group titanium nitride, titanium carbonitride and titanium carboboronnitride with a total layer thickness in the range of from 0.1 μm to 3 μm furthermore being applied onto the titanium diboride layer.

Is also advantageous for the hard material coating to be subjected to a blasting treatment with one or more metals from the group aluminum, copper, zinc, titanium, nickel, tin or base alloys of these metals.

This further improves the sliding property of the surface, so that the susceptibility to adhesion with the swarf being removed is further reduced.

Cutting tools which are provided with a hard material coating according to the invention may be used particularly advantageously for the machining of materials that do not contain iron, such as titanium, aluminum and alloys thereof.

When processing these materials, the smoothness of the hard material coating according to the invention, resulting from the fine-grained structure of the titanium diboride layer, is particularly favorable for machining these materials.

In a thermal CVD method for producing the hard material coating according to the invention, at a temperature in the range of from 700° C. to 900° C., a gas mixture which consists of from 2.5 to 50 vol. % hydrogen, from 0.1 to 10 vol. % $TiCl_4$ and from 0.2 to 20 vol. % $BCl_3$, the remainder being inert gas, preferably argon, is used in order to produce the titanium diboride layer.

The structure of the hard material coating, which is much more fine-grained in comparison with the prior art, can be achieved by this method.

If the limits of the reaction components are exceeded in the gas composition, this leads to coarse-grained irregular layer structures. When falling below the limits, undesired phases are formed in the edge zone of the substrates to be coated.

In a particularly advantageous application of the method according to the invention, a gas mixture having the composition 5 to 20 vol. % hydrogen, 0.2 to 1 vol. % $TiCl_4$, 0.4 to 2 vol. % $BCl_3$, the remainder being inert gas, preferably argon, is used in order to produce the titanium diboride layer, and the coating is carried out under normal pressure.

In another advantageous variant of the coating method for producing the hard material coating according to the invention, the gas mixture is initially introduced into the reaction space without the $BCl_3$ component, and the $BCl_3$ component is added after a period of from 0.5 to 5 minutes. In this way, even very minor diffusion of boron into the underlying material is avoided.

The invention will be explained in more detail below with the aid of figures and production examples.

DESCRIPTION OF THE INVENTION

Example 1

In a graphite susceptor having a diameter of 200 mm and a height of 280 mm, disposable cutting inserts made of hard metal were coated according to the invention with a gas composition consisting of 10 vol. % hydrogen, 0.4 vol. % $TiCl_4$, 0.7 vol. % $BCl_3$ and 88.9 vol. % argon for 1 hour under normal pressure at a temperature of 800° C. by a thermal CVD method. A very uniform titanium diboride layer with a thickness of about 2.5 µm was thereby formed on the disposable cutting inserts.

Figure 1:
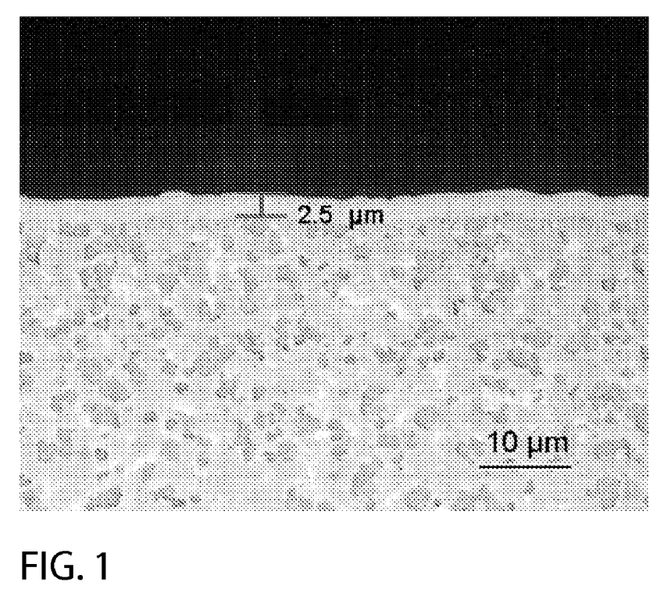
FIG. 1 shows the micrograph of a disposable cutting insert coated according to the invention according to Example 1, in a light microscopy examination with about 1500 times magnification

FIG. 1 clearly shows that the edge zone of the hard metal substrate next to the titanium diboride layer is entirely free of an η phase or a diffusion zone containing boron.

Figure 2:
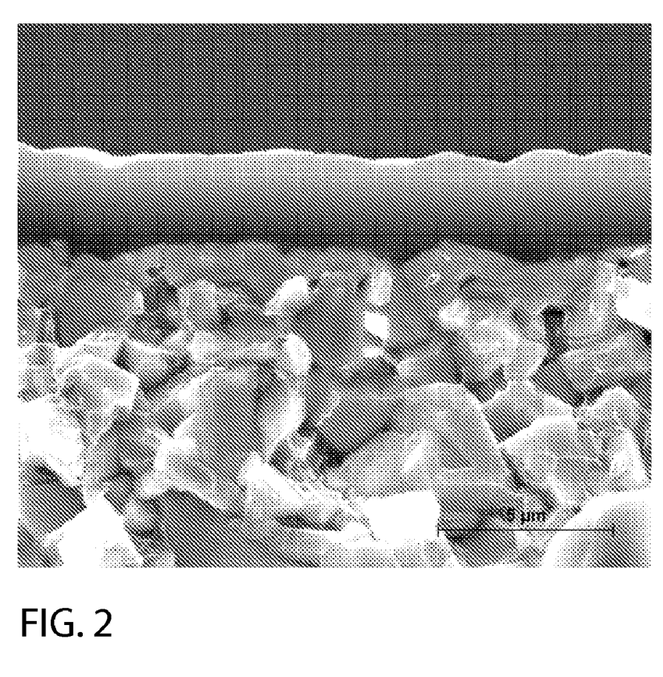
FIG. 2 shows the fractograph of the structure of the disposable cutting insert according to FIG. 1 in a scanning electron microscope examination with about 6000 times magnification

The fine granularity of the surface can already be seen clearly from FIG. 2, the grain size no longer being recognizable.

Figure 3:
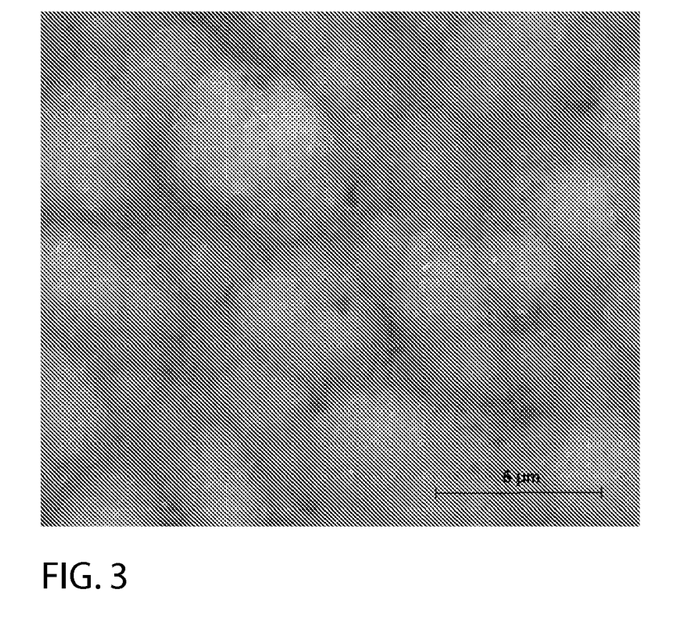
FIG. 3 shows the surface image of the disposable cutting insert according to FIG. 1 in a scanning electron microscope examination with about 6000 times magnification

FIG. 3 likewise reveals the fine granularity of the surface, the extent of which is such that exact grain sizes cannot be seen from this figure.

In order to be able to determine the grain sizes more exactly, a disposable cutting insert coated according to the invention was also examined by means of TEM (transmission electron microscopy).

Figure 4:
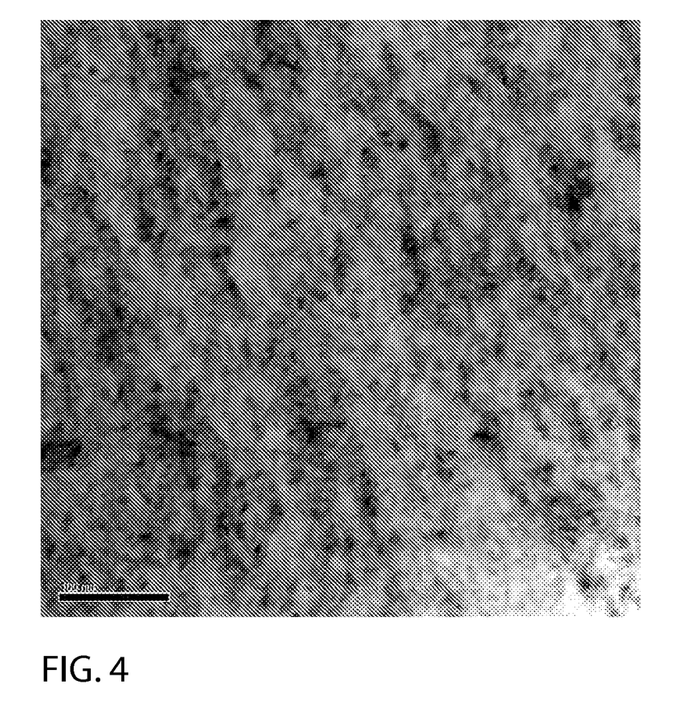
FIG. 4 shows the structural image of the coating of the disposable cutting insert according to FIG. 1 in a transmission electron microscope (TEM) examination with about 200,000 times magnification

The extremely fine granularity of the crystal structure with an average grain size in the range of 10-30 nm can be seen from FIG. 4.

Figure 5:
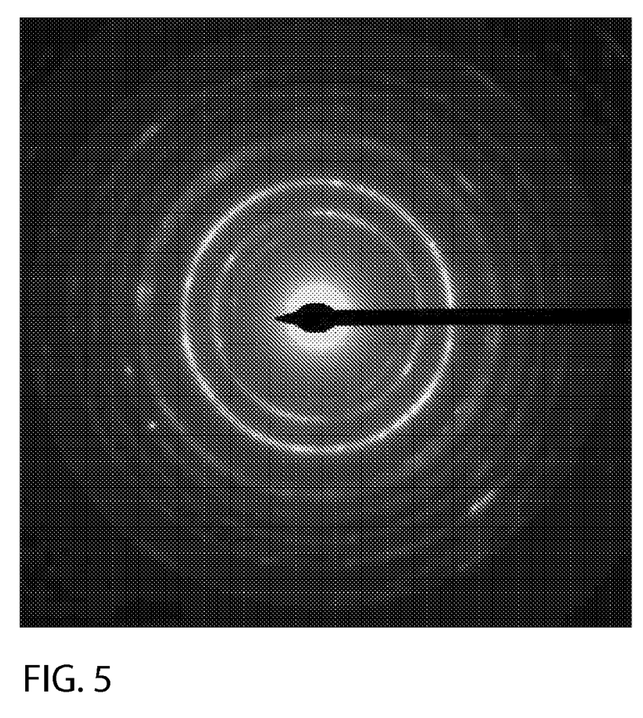
FIG. 5 shows the electron diffraction image of the coating of the disposable cutting insert according to FIG. 1

An electron diffraction of the sample, which also shows the uniformity of the crystal structure, can be seen in FIG. 5.

Example 2

For comparative purposes, disposable cutting inserts identical to those coated according to Example 1 were coated using a thermal CVD coating method according to the prior art corresponding to DE 25 25 185. The coating was carried out in the same graphite susceptor as in Example 1, with a gas composition consisting of 99.74 vol. % hydrogen, 0.22 vol. % $TiCl_4$ and 0.04 vol. % $BCl_3$ for 2 hours under normal pressure at a temperature of 1000° C. A very nonuniform titanium diboride layer was formed, the average layer thickness of which corresponds approximately to the layer thickness of the layer according to the invention produced according to Example 1.

Figure 6:
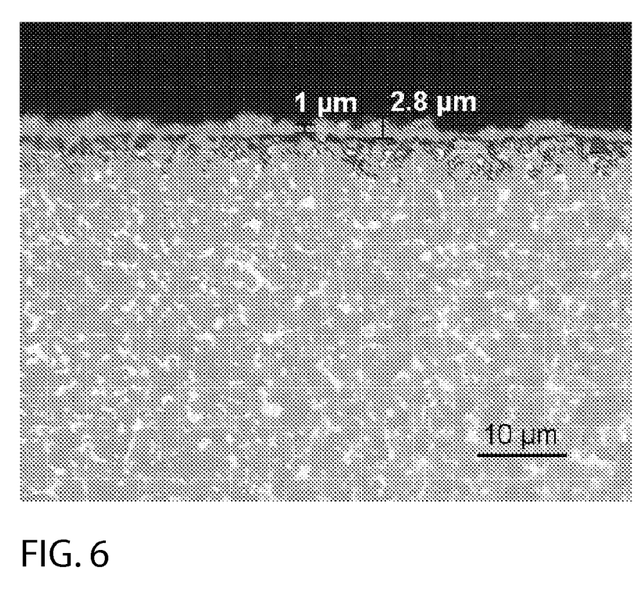
FIG. 6 shows the micrograph of a disposable cutting insert coated according to Example 2 according to the prior art, in a light microscopy examination with about 1500 times magnification

FIG. 6 clearly shows the nonuniformity of this layer and its inhomogeneity. The edge zone of the hard metal substrate furthermore has a pronounced η phase.

In a milling test, the disposable cutting inserts coated according to Examples 1 and 2 were compared with one another.

Figure 7:
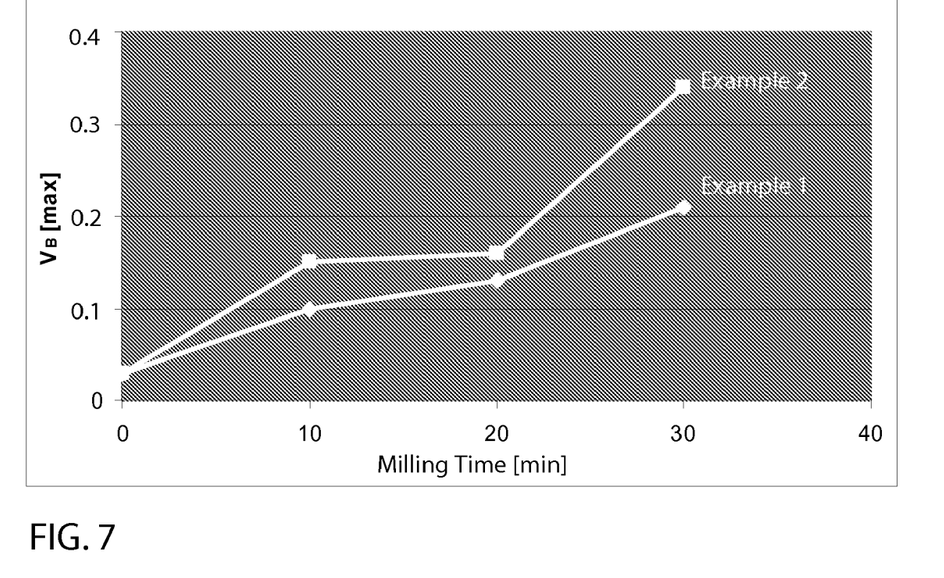
FIG. 7 shows the wear diagram of a comparative milling test between a disposable cutting insert which was coated according to Example 1 and a disposable cutting insert which was coated according to Example 2

FIG. 7 shows the service lives of the disposable cutting inserts when milling a TiAl6V4 titanium alloy under the cutting conditions $v_c$=50 m/min, $f_z$=0.12 mm, $a_p$=5 mm, $a_e$=49.9 mm, with cooling.

For the disposable cutting insert according to the prior art, coated according to Example 2, the critical wear value $V_B$ [max] of 0.3 mm is already reached after a milling time of 27 minutes, while the disposable cutting insert coated according to the invention according to Example 1 does not have a wear of 0.2 mm until after a milling time of 30 minutes, i.e. the wear of the disposable cutting insert according to the prior art is more than 30% greater than on that coated according to the invention.

Example 3

For comparative purposes, disposable cutting inserts identical to those coated according to Example 1 were coated using a PVD method according to the prior art with a titanium diboride layer having a thickness of about 2.5 µm, comparable with the layer thickness according to Example 1.

Figure 8:
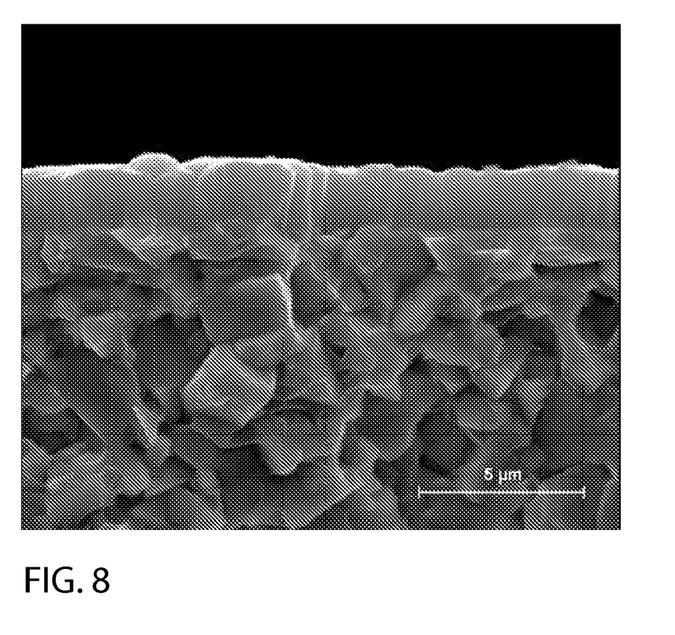
FIG. 8 shows the fractograph of the structure of the disposable cutting insert which was coated according to Example 3 according to the prior art by a PVD method, in a scanning electron microscope examination with about 6000 times magnification

FIG. 8 shows the columnar structure of this titanium diboride layer.

Figure 9:
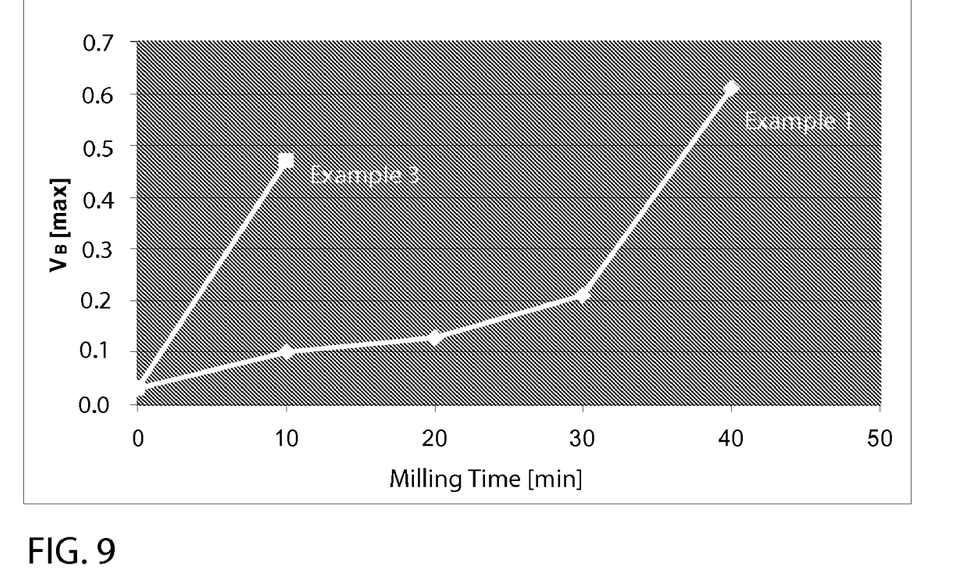
FIG. 9 shows the wear diagram of a comparative milling test between a disposable cutting insert which was coated according to Example 1 and a disposable cutting insert which was coated according to Example 3

In a milling test under the same conditions as described above in the comparison of Examples 1 and 2, the service lives of the disposable cutting inserts coated according to Example 1 and Example 3 were compared with one another according to FIG. 9. In terms of a critical free surface wear width $V_B$ [max] of 0.3 mm, a service life of 6.4 minutes was achieved by the disposable cutting insert coated according to the prior art according to Example 3, while a service life of 32.3 minutes was achieved by the disposable cutting insert coated according to Example 1, which corresponds to a 5-fold increase in the wear resistance.

Example 4

Disposable cutting inserts identical to those in Example 1 were coated according to the invention in the same coating apparatus as in Example 1 with an approximately 1 µm thick titanium nitride layer in a first step using a thermal CVD method. An approximately 3 µm thick titanium diboride layer according to the invention was subsequently deposited under the same conditions as in Example 1, except for the coating time which was 75 minutes in this example.

Figure 10:
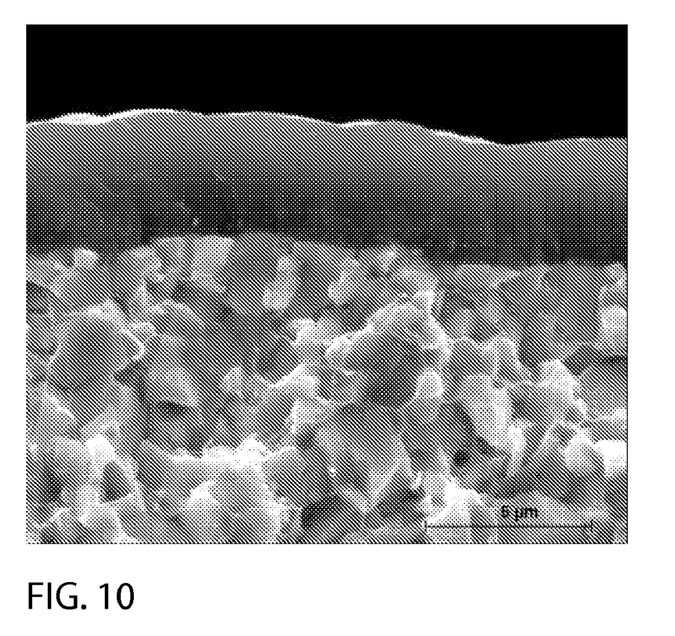
FIG. 10 shows the fractograph of the structure of a disposable cutting insert which was coated according to the invention according to Example 4, in a scanning electron microscope examination with about 6000 times magnification

FIG. 10 shows the known column structure of the titanium nitride layer and the extremely fine-grained titanium diboride layer on top of it.

Example 5

Disposable cutting inserts identical to those in Example 1 were coated according to the invention in the same coating apparatus as in Example 1 with an approximately 1 μm thick titanium nitride layer in a first step using a thermal CVD method as in Example 4. An approximately 2.6 μm thick titanium diboride layer according to the invention was subsequently deposited under the same conditions as in Example 1, except for the coating time which was 65 minutes in this example. Another titanium nitride layer approximately 1 μm thick was subsequently deposited onto the titanium diboride layer. The disposable cutting inserts coated in this way were subsequently coated with a corresponding cover layer approximately 0.2 μm thick by a blasting treatment using a copper alloy.

The service lives of the disposable cutting inserts coated according to Example 4 and Example 5 were determined in a milling test under the same conditions as described above in the comparison of Examples 1 and 2. In terms of a critical free surface wear width $V_B$ [max] of 0.3 mm, a service life of 30.3 minutes was achieved by the disposable cutting insert coated according to the invention according to Example 4, while a service life of 37.8 minutes was achieved by the disposable cutting insert coated according to the invention according to Example 5.

Example 6

For comparative purposes, disposable cutting inserts identical to those coated according to Example 1 were coated with an approximately 3 μm thick titanium diboride layer using a thermal CVD coating method according to the prior art corresponding to EP 0 015 451 in the same coating apparatus as in Example 1. To this end, a gas mixture having the composition 94.7 vol. % hydrogen,
3.3 vol. % $BCl_3$ and 2 vol. % $TiCl_4$ was used. The coating time was 45 minutes at a temperature of 800° C.

Figure 11:
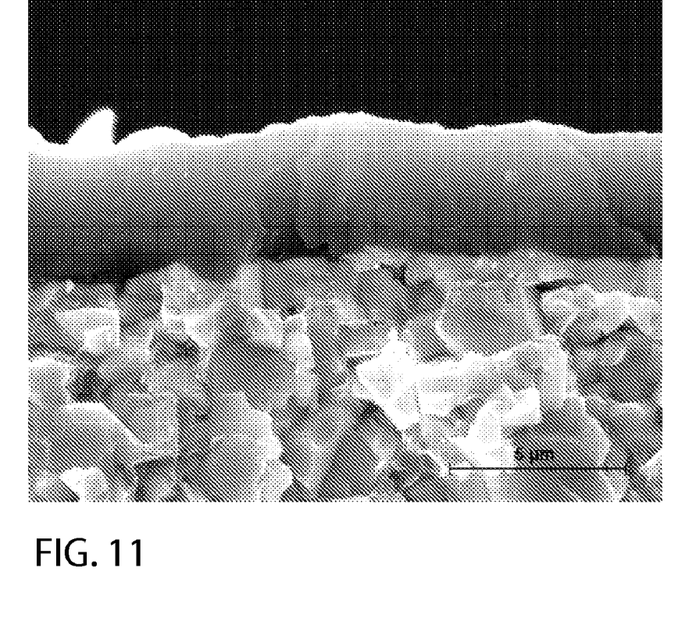
FIG. 11 shows the fractograph of the structure of the disposable cutting insert which was coated according to Example 6 according to the prior art, in a scanning electron microscope examination with about 6000 times magnification
Figure 12:
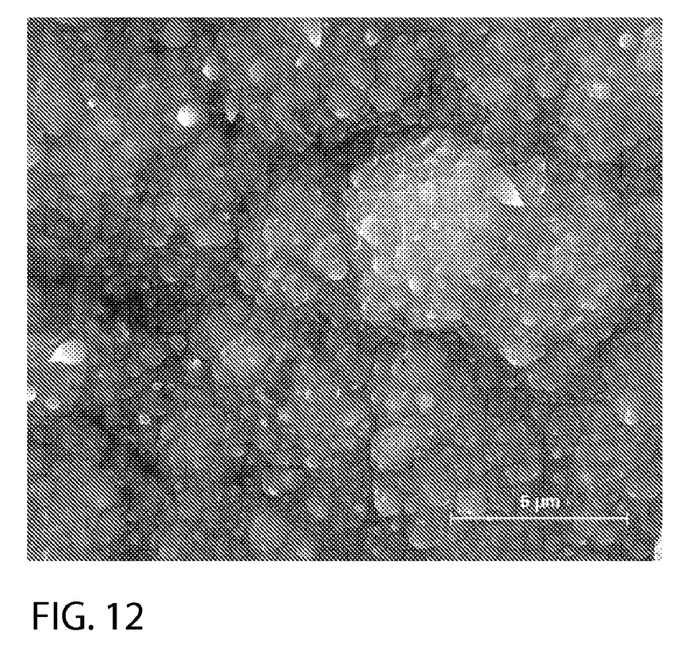
FIG. 12 shows the surface image of the disposable cutting insert according to FIG. 11 in a scanning electron microscope examination with about 6000 times magnification

FIG. 11, and in particular FIG. 12, clearly show the coarse-grained structure of the layer with a grain size of about 0.5-1 μm.

Example 7

Disposable cutting inserts identical to those in Example 1 were coated according to the invention using a thermal CVD method with the same gas composition as in Example 1 for 30 minutes under normal pressure at a temperature of 800° C. A very uniform titanium diboride layer with a thickness of about 1.2 μm was thereby formed on the disposable cutting inserts.

Figure 13:
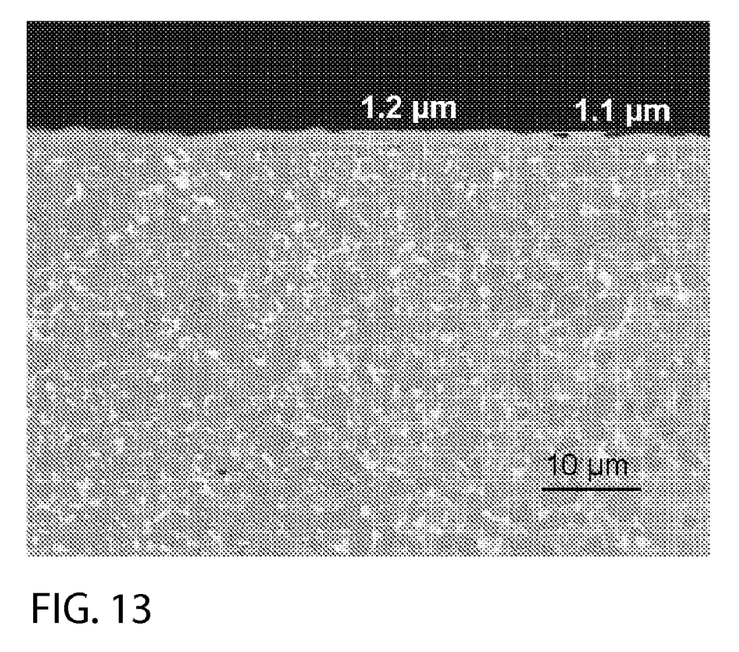
FIG. 13 shows the micrograph of a disposable cutting insert coated according to the invention according to Example 7, in a light microscopy examination with about 1500 times magnification

FIG. 13 shows the uniformity of the coating. It can also be seen that the edge zone of the hard metal substrate is entirely free of an η phase and does not have a diffusion zone containing boron.

Example 8

For comparative purposes, disposable cutting inserts identical to those coated according to Example 1 were coated using a thermal CVD coating method in the same coating apparatus as in Example 1, according to the prior art corresponding to DE 25 25 185. The coating was carried out in the same graphite susceptor as in Example 1 with the same gas composition under the same coating conditions as in Example 2, except that the coating time was only 1 hour. A very nonuniform titanium diboride layer with a maximum layer thickness of 1.4 μm was thereby formed.

Figure 14:
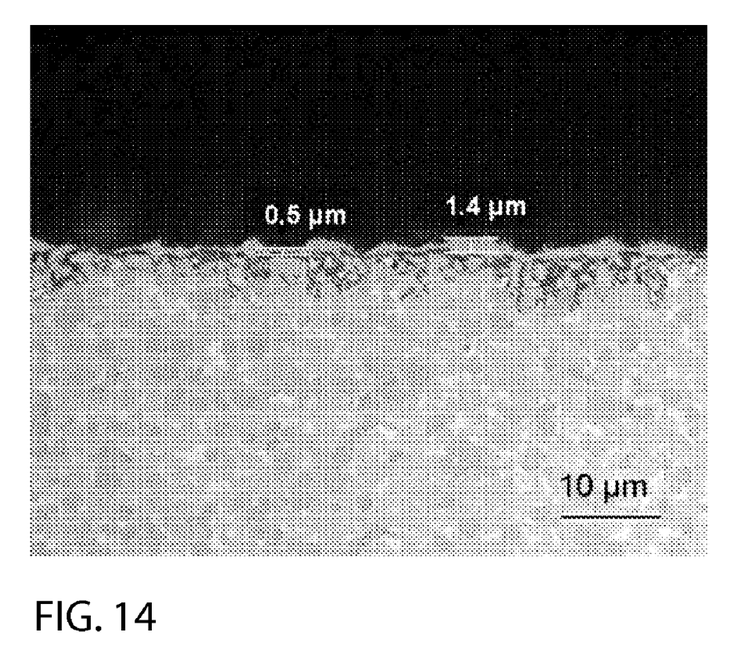
FIG. 14 shows the micrograph of a disposable cutting insert coated according to Example 8 according to the prior art, in a light microscopy examination with about 1500 times magnification
Figure 15:
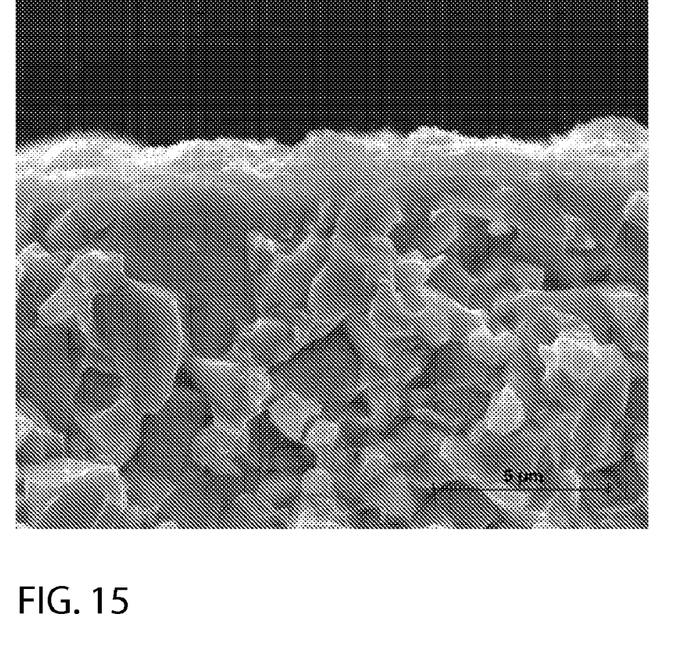
FIG. 15 shows the fractograph of the structure of the disposable cutting insert according to FIG. 14 in a scanning electron microscope examination with about 6000 times magnification

FIGS. 14 and 15 show the nonuniformity of the layer.
A very pronounced η zone in the edge region of the hard metal substrate can also be seen in FIG. 14.

Figure 16:
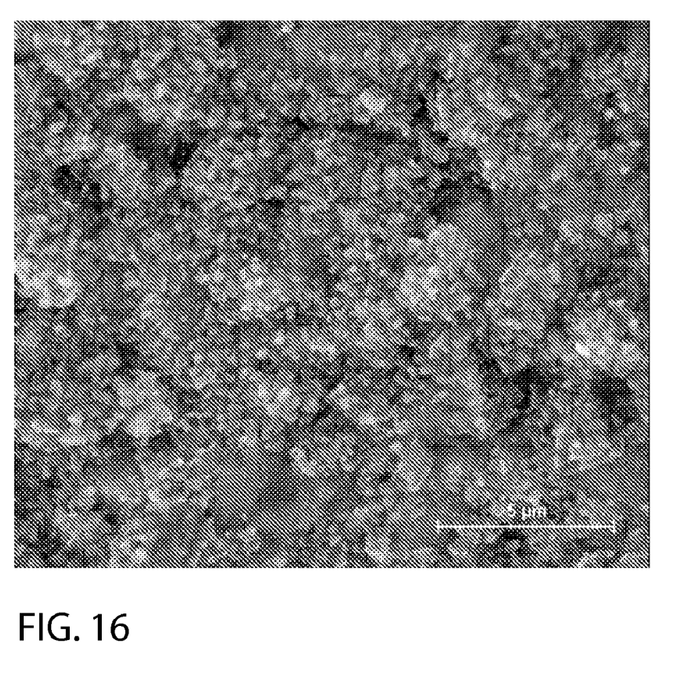
FIG. 16 shows the surface image of the structure of the disposable cutting insert according to FIG. 14 in a scanning electron microscope examination with about 6000 times magnification

FIG. 16 shows the coarse-grained structure of the surface, the grain size lying in the range of 0.5-1 μm.

The service lives of the disposable cutting inserts coated according to Example 7 and Example 8 were determined in a milling test under the same conditions as in the previous milling tests.

Figure 17:
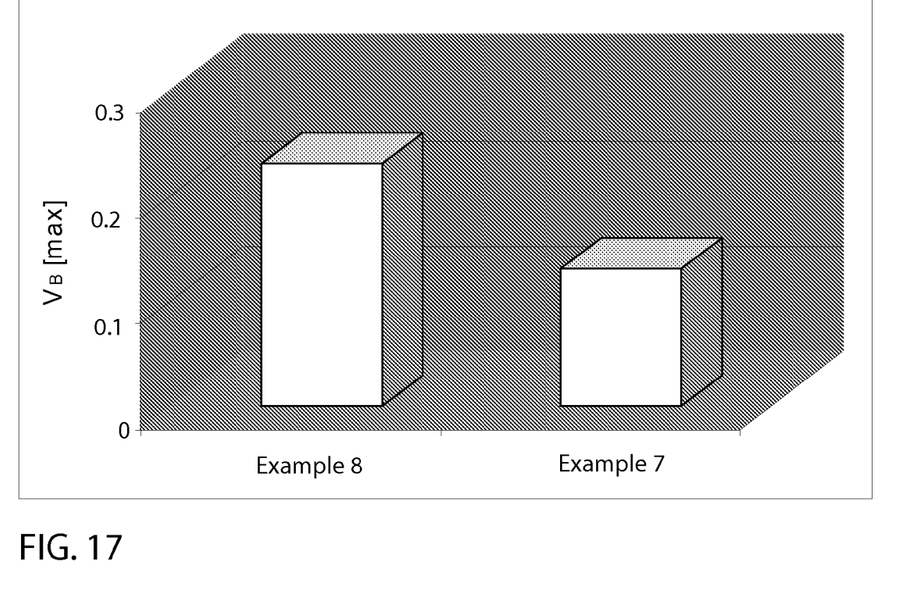
FIG. 17 shows the wear diagram of a comparative milling test between a disposable cutting insert which was coated according to Example 7 and a disposable cutting insert which was coated according to Example 8

As can be seen from FIG. 17, the free surface wear width $V_B$ after a milling length of 400 mm is 0.1 mm on the disposable cutting insert coated according to Example 7, while on the disposable cutting insert coated according to the prior art according to Example 8 it is 0.2 mm, which means that this disposable cutting insert wears two times as fast.

The invention claimed is:

1. A cutting tool, comprising:
a substrate being a cutting tool substrate;
a hard material coating on said substrate, said hard material coating having one or more layers, including at least one titanium diboride layer deposited by a thermal CVD process;
said titanium diboride layer having a thickness of at least 0.1 μm and having a fine-grained structure with an average grain size of at most 50 nm; and
wherein no boron-containing diffusion zone exists in a material of said cutting tool substrate.

2. The cutting tool according to claim 1, wherein said titanium diboride layer has a layer thickness in a range from 0.1 μm to 15 μm.

3. The cutting tool according to claim 1, wherein said titanium diboride layer has a layer thickness in a range from 1 μm to 10 μm.

4. The cutting tool according to claim 1, wherein said substrate is formed of hard metal.

5. The cutting tool according to claim 1, wherein said substrate consists of hard metal.

6. The cutting tool according to claim 1, wherein the cutting tool is a disposable cutting insert.

7. The cutting tool according to claim 6, wherein said hard material coating of said cutting insert includes a plurality of layers, and said titanium diboride layer is disposed in alternation with one or more other hard material layers.

8. The cutting tool according to claim 7, wherein a layer structure of said hard material coating, starting from a substrate surface, consists of one or more layers selected from the group consisting of titanium nitride, titanium carbonitride, and titanium carboboronnitride with a total layer thickness in a range from 0.1 μm to 3 μm, followed by a titanium diboride layer having a thickness from 1 μm to 5 μm.

9. The cutting tool according to claim 7, which further comprises a cover layer consisting of one or more layers selected from the group consisting of titanium nitride, titanium carbonitride, and titanium carboboronnitride with a total layer thickness in a range of 0.1 μm to 3 μm disposed on said titanium diboride layer.

10. The cutting tool according to claim 1, wherein a surface of said hard material coating has the characteristics of a coating treated by a blasting treatment with one or more metals selected from the group consisting of aluminum, copper, zinc, titanium, nickel, tin, or base alloys thereof.

11. The cutting tool according to claim 1, configured as a tool for machining materials that do not contain iron.

12. The cutting tool according to claim 11, wherein said cutting tool is configured for machining titanium, aluminum, and alloys thereof.

13. A method of producing a coated article of manufacture being a cutting tool, the method which comprises:
 providing a substrate;
 coating the substrate in a thermal CVD process at a temperature in a range of from 700° C. to 950° C. and with a gas mixture consisting of:
 2.5 to 50 vol. % hydrogen;
 0.1 to 10 vol. % $TiCl_4$;
 0.2 to 20 vol. % $BCl_3$; and
 a remainder of inert gas;
 to thereby form a coating with a titanium diboride layer and the cutting tool according to claim 1 having no boron-containing diffusion zone in the substrate.

14. The method according to claim 13, wherein the inert gas used in the thermal CVD process is argon.

15. The method according to claim 13, which comprises forming the titanium diboride layer from a gas mixture composed of 5 to 20 vol. % hydrogen, 0.2 to 1 vol. % $TiCl_4$, 0.4 to 2 vol. % $BCl_3$, and the remainder of inert gas, and carrying out the coating process under normal pressure.

16. The method according to claim 13, which comprises initially introducing the gas mixture into a reaction space without the $BCl_3$ component, and adding the $BCl_3$ component after a period of between 0.5 and 5 minutes.

* * * * *